United States Patent
Peidous et al.

(10) Patent No.: US 11,587,825 B2
(45) Date of Patent: Feb. 21, 2023

(54) METHOD OF PREPARING AN ISOLATION REGION IN A HIGH RESISTIVITY SILICON-ON-INSULATOR SUBSTRATE

(71) Applicant: GlobalWafers Co., Ltd., Hsinchu (TW)

(72) Inventors: Igor Peidous, Liberty Township, OH (US); Jeffrey L. Libbert, O'Fallon, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 123 days.

(21) Appl. No.: 17/034,159

(22) Filed: Sep. 28, 2020

(65) Prior Publication Data

US 2021/0013091 A1 Jan. 14, 2021

Related U.S. Application Data

(62) Division of application No. 16/352,203, filed on Mar. 13, 2019, now Pat. No. 10,825,718, which is a
(Continued)

(51) Int. Cl.
*H01L 21/762* (2006.01)
*H01L 21/304* (2006.01)
(Continued)

(52) U.S. Cl.
CPC .... *H01L 21/76254* (2013.01); *H01L 21/0262* (2013.01); *H01L 21/02238* (2013.01);
(Continued)

(58) Field of Classification Search
CPC ......... H01L 21/76254; H01L 21/02238; H01L 21/02381; H01L 21/02488;
(Continued)

(56) References Cited

U.S. PATENT DOCUMENTS 3,909,304 A 9/1975 Cho
4,501,060 A 2/1985 Frye et al.
(Continued)

FOREIGN PATENT DOCUMENTS

EP 0939430 A2 9/1999
EP 1865551 A2 12/2007
(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.
(Continued)

*Primary Examiner* — Nilufa Rahim
(74) *Attorney, Agent, or Firm* — Armstrong Teasdale LLP

(57) ABSTRACT

A multilayer composite structure and a method of preparing a multilayer composite structure are provided. The multilayer composite structure comprises a semiconductor handle substrate having a minimum bulk region resistivity of at least about 500 ohm-cm and an isolation region that impedes the transfer of charge carriers along the surface of the handle substrate and reduces parasitic coupling between RF devices.

16 Claims, 11 Drawing Sheets

Related U.S. Application Data division of application No. 15/623,519, filed on Jun. 15, 2017, now Pat. No. 10,269,617.

(60) Provisional application No. 62/353,301, filed on Jun. 22, 2016.

(51) Int. Cl.
    *H01L 21/02* (2006.01)
    *H01L 21/761* (2006.01)
    *H01L 29/06* (2006.01)
    *H01L 21/322* (2006.01)
    *H01L 21/265* (2006.01)

(52) U.S. Cl.
CPC .. *H01L 21/02381* (2013.01); *H01L 21/02488* (2013.01); *H01L 21/02532* (2013.01); *H01L 21/02576* (2013.01); *H01L 21/02595* (2013.01); *H01L 21/02634* (2013.01); *H01L 21/304* (2013.01); *H01L 21/3226* (2013.01); *H01L 21/761* (2013.01); *H01L 29/0646* (2013.01); *H01L 29/0649* (2013.01); *H01L 21/0214* (2013.01); *H01L 21/0217* (2013.01); *H01L 21/02164* (2013.01); *H01L 21/02181* (2013.01); *H01L 21/02186* (2013.01); *H01L 21/02189* (2013.01); *H01L 21/02192* (2013.01); *H01L 21/02255* (2013.01); *H01L 21/26513* (2013.01); *H01L 21/26533* (2013.01)

(58) Field of Classification Search
CPC ......... H01L 21/02532; H01L 21/02576; H01L 21/02595; H01L 21/0262; H01L 21/02634; H01L 21/304; H01L 21/3226; H01L 21/761; H01L 21/0214; H01L 21/02164; H01L 21/0217; H01L 21/02181; H01L 21/02186; H01L 21/02189; H01L 21/02192; H01L 21/02255; H01L 21/26513; H01L 21/26533; H01L 29/0646; H01L 29/0649

See application file for complete search history.

(56) References Cited

U.S. PATENT DOCUMENTS

| | | |
|---|---|---|
| 4,755,865 A | 7/1988 | Wilson et al. |
| 4,968,384 A | 11/1990 | Asano |
| 5,189,500 A | 2/1993 | Kusunoki |
| 5,461,250 A | 10/1995 | Burghartz et al. |
| 6,043,138 A | 3/2000 | Ibok |
| 6,204,205 B1 | 3/2001 | Yu et al. |
| 6,271,144 B1 | 8/2001 | Monget et al. |
| 6,373,113 B1 | 4/2002 | Gardner et al. |
| 6,479,166 B1 | 11/2002 | Heuer et al. |
| 6,562,127 B1 | 5/2003 | Kud et al. |
| 6,562,703 B1 | 5/2003 | Maa et al. |
| 6,624,047 B1 | 9/2003 | Sakaguchi et al. |
| 7,018,882 B2 | 3/2006 | Tweet et al. |
| 7,166,520 B1 | 1/2007 | Henley |
| 7,868,419 B1 | 1/2011 | Kerr et al. |
| 7,879,699 B2 | 2/2011 | Schulze et al. |
| 7,915,716 B2 | 3/2011 | Pisigan et al. |
| 8,058,137 B1 | 11/2011 | Or-Bach et al. |
| 8,076,750 B1 | 12/2011 | Kerr et al. |
| 8,466,036 B2 | 6/2013 | Brindle et al. |
| 8,481,405 B2 | 7/2013 | Arriagada et al. |
| 8,796,116 B2 | 8/2014 | Grabbe et al. |
| 8,846,493 B2 | 9/2014 | Libbert et al. |
| 8,859,393 B2 | 10/2014 | Ries et al. |
| 9,202,711 B2 | 12/2015 | Liu et al. |
| 2002/0090758 A1 | 7/2002 | Henley et al. |
| 2004/0003769 A1 | 1/2004 | Tamatsuka et al. |
| 2004/0005740 A1 | 1/2004 | Lochtefeld et al. |
| 2004/0031979 A1 | 2/2004 | Lochtefeld et al. |
| 2004/0077184 A1 | 4/2004 | Anderson et al. |
| 2004/0108537 A1 | 6/2004 | Tiwari |
| 2004/0213907 A1 | 10/2004 | Todd et al. |
| 2005/0026432 A1 | 2/2005 | Atwater et al. |
| 2005/0153524 A1 | 7/2005 | Maa et al. |
| 2005/0167002 A1 | 8/2005 | Ghyselen et al. |
| 2006/0030124 A1 | 2/2006 | Maa et al. |
| 2006/0033110 A1 | 2/2006 | Alam et al. |
| 2006/0046431 A1 | 3/2006 | Blietz et al. |
| 2006/0226482 A1 | 10/2006 | Suvorov |
| 2006/0281233 A1 | 12/2006 | Aoki et al. |
| 2007/0032040 A1 | 2/2007 | Lederer |
| 2007/0054466 A1 | 3/2007 | Hebras |
| 2007/0200144 A1 | 8/2007 | Aspar et al. |
| 2008/0171443 A1 | 7/2008 | Hebras |
| 2008/0299744 A1 | 12/2008 | Yamazaki et al. |
| 2009/0004833 A1 | 1/2009 | Suzuki et al. |
| 2009/0014828 A1 | 1/2009 | Mizushima et al. |
| 2009/0092810 A1 | 4/2009 | Lee et al. |
| 2009/0117716 A1 | 5/2009 | Shimomura et al. |
| 2009/0278233 A1 | 11/2009 | Pinnington et al. |
| 2009/0321829 A1 | 12/2009 | Nguyen et al. |
| 2011/0174362 A1 | 7/2011 | Tanner et al. |
| 2011/0298083 A1 | 12/2011 | Yoneda |
| 2012/0091587 A1 | 4/2012 | Or-Bach et al. |
| 2012/0161310 A1 | 6/2012 | Brindle et al. |
| 2012/0238070 A1 | 9/2012 | Libbert et al. |
| 2012/0267681 A1 | 10/2012 | Nemoto et al. |
| 2013/0120951 A1 | 5/2013 | Zuo et al. |
| 2013/0122672 A1 | 5/2013 | Or-Bach et al. |
| 2013/0168835 A1 | 7/2013 | Botula et al. |
| 2013/0186455 A1 | 7/2013 | Liu et al. |
| 2013/0193445 A1 | 8/2013 | Dennard et al. |
| 2013/0294038 A1 | 11/2013 | Landru et al. |
| 2013/0344680 A1 | 12/2013 | Arriagada et al. |
| 2014/0042598 A1 | 2/2014 | Kitada et al. |
| 2014/0070215 A1 | 3/2014 | Bedell et al. |
| 2014/0084290 A1 | 3/2014 | Allibert et al. |
| 2014/0120654 A1 | 5/2014 | Fujii |
| 2014/0124902 A1 | 5/2014 | Botula et al. |
| 2014/0273405 A1 | 9/2014 | Liu et al. |
| 2015/0004778 A1 | 1/2015 | Botula et al. |
| 2015/0104926 A1 | 4/2015 | Libbert et al. |
| 2015/0112308 A1 | 4/2015 | Ishida |
| 2015/0115480 A1 | 4/2015 | Peidous et al. |
| 2016/0108551 A1 | 4/2016 | Basak et al. |
| 2016/0351437 A1 | 12/2016 | Peidous et al. |
| 2017/0033002 A1* | 2/2017 | Meguro ............ H01L 21/02595 |
| 2017/0345663 A1 | 11/2017 | Ishizuka et al. |

FOREIGN PATENT DOCUMENTS

| | | |
|---|---|---|
| EP | 2426701 A1 | 3/2012 |
| EP | 2503592 A1 | 9/2012 |
| EP | 2579303 A1 | 4/2013 |
| JP | H01315144 A | 12/1989 |
| JP | 2012253364 A | 12/2012 |
| WO | 2009120407 A2 | 10/2009 |
| WO | 2012127006 A1 | 9/2012 |
| WO | 2015112308 A1 | 7/2015 |
| WO | 2015119742 A1 | 8/2015 |

OTHER PUBLICATIONS

Lederer, D et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

(56) References Cited

OTHER PUBLICATIONS

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physics Letters, American Institute of Physics May 18, 1998, pp. 2544-2546, vol. 72, No. 20.

Lu, Hongqiang et al., Characterization of methyl-doped silicon oxide film deposited using Flowfil(TM) chemical vapor deposition technology, Journal of Vacuum Science and Technology, Part B, May 2002, pp. 828-833, vol. 20, No. 3, Melville, New York.

Tong, Q. Y. et al., Semiconductor wafer bonding: recent developments, Materials Chemistry and Physics, Mar. 1994, pp. 101/127, vol. 37, No. 2, Elsevier Sequoia.

Porrini, M. et al., Growth of Large Diameter High purity Silicon Single Crystals With The MCZ Method For Power Devices Applications, MADEP, Symposium On Materials and Devices For Powerelectronics, EPE Europen Conference On Power Electronics and Applications, Sep. 2, 1991, pp. 90-93.

\* cited by examiner

METHOD OF PREPARING AN ISOLATION REGION IN A HIGH RESISTIVITY SILICON-ON-INSULATOR SUBSTRATE

CROSS REFERENCE TO RELATED APPLICATION(S)

This application is a divisional of U.S. application Ser. No. 16/352,203, which was filed Mar. 13, 2019, which is hereby incorporated by reference as if set forth in its entirety. U.S. application Ser. No. 16/352,203 is a divisional application of U.S. application Ser. No. 15/623,519, which was filed Jun. 15, 2017 and has granted as U.S. Pat. No. 10,269,617 B2, and which is hereby incorporated by reference as if set forth in its entirety. U.S. application Ser. No. 15/623,519 claims the benefit of U.S. Provisional Application Ser. No. 62/353,301, filed Jun. 22, 2016. The priority provisional application is incorporated by reference herein as if set forth in its entirety.

FIELD OF THE INVENTION

The present invention generally relates to the field of semiconductor wafer manufacture. More specifically, the present invention relates to a method of preparing a handle substrate for use in the manufacture of a semiconductor-on-insulator (e.g., silicon-on-insulator) structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. Positive charges in the buried oxide layer (BOX) in a semiconductor on insulator structure and electric fields of operating devices induce inversion and accumulation charges under the front surface of the handle substrate of the semiconductor on insulator structure. The layers formed of these charges provide effective paths for the parasitic coupling between RF devices that enhances device cross-talking, power dissipation, and harmonic distortion of RF signals.

SUMMARY OF THE INVENTION

The present invention is directed to a method of preparing a multilayer structure, the method comprising: implanting $As^+$ ions through a front surface of a single crystal semiconductor handle substrate to thereby form an isolation region comprising arsenic-doped semiconductor, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk resistivity of at least about 500 ohm-cm; depositing a dielectric layer on the front surface of the single crystal semiconductor handle substrate; and bonding a front surface of a single crystal semiconductor donor substrate to the dielectric layer of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, and further wherein the semiconductor donor substrate comprises a cleave plane.

The present invention is further directed to a method of preparing a multilayer structure, the method comprising: implanting $O^+$ ions through a front surface of a single crystal semiconductor handle substrate to thereby form an isolation region comprising semiconductor oxide, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk resistivity of at least about 500 ohm-cm; depositing a dielectric layer on the front surface of the single crystal semiconductor handle substrate; and bonding a front surface of a single crystal semiconductor donor substrate to the dielectric layer of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, and further wherein the semiconductor donor substrate comprises a cleave plane.

The present invention is still further directed to a method of preparing a multilayer structure, the method comprising: thermally oxidizing a front surface of a single crystal semiconductor handle substrate to thereby grow an oxide layer on the front surface of the single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk resistivity of at least about 500 ohm-cm; depositing a polycrystalline silicon layer on the oxide layer; depositing a dielectric layer on the polycrystalline silicon layer; and bonding a front surface of a single crystal semiconductor donor substrate to the dielectric layer of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, and further wherein the semiconductor donor substrate comprises a cleave plane.

The present invention is still further directed to a method of preparing a multilayer structure, the method comprising: epitaxially depositing an epitaxial arsenic-doped silicon layer on a front surface of a single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk resistivity of at least about 500 ohm-cm; epitaxially depositing an epitaxial silicon layer on the arsenic-doped silicon layer; depositing a dielectric layer on the silicon layer; and bonding a front surface of a single crystal semiconductor donor substrate to the dielectric layer of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, and further wherein the semiconductor donor substrate comprises a cleave plane.

Other objects and features will be in part apparent and in part pointed out hereinafter.

DETAILED DESCRIPTION OF THE EMBODIMENT(S) OF THE INVENTION

According to the present invention, a method is provided for fabricating a high resistivity semiconductor on insulator (HR-SOI) wafer for radiofrequency (RF) device applications involving lateral device isolation with trenches. The isolation region is extended into the handle substrate under the dielectric layer, e.g., a buried oxide layer (BOX). Such isolation region impedes the transfer of charge carriers along the surface of the handle substrate and reduces the parasitic coupling between RF devices. The present invention proposes to embed an additional thin isolation region under the surface of the semiconductor handle substrate. Said isolation region may be based any of p/n junction, dielectric, or semi-insulating material. Said isolation region further suppresses the cross-talk between devices, power losses, and harmonic distortions of device signals.

Figure 1:
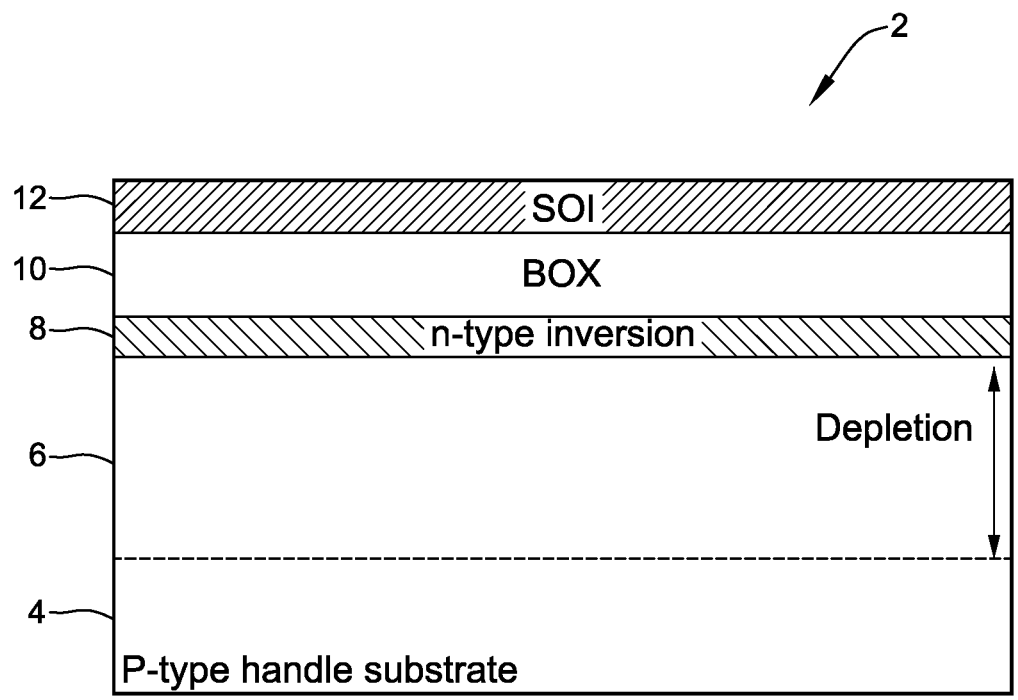
FIG. 1 is a depiction of an HR-SOI structure comprising a depletion layer and an n-type inversion region.

In general, a high resistivity semiconductor on insulator (HR-SOI) wafer for radiofrequency (RF) device applications is generally p-type (e.g., boron doped) with a typical resistivity in the range of about 1000 ohm cm to about 2000 ohm cm. The HR-SOI structure additionally comprises a dielectric layer, generally a buried oxide layer (BOX) that comprises positive charges. The typical positive charges in a BOX layer deplete holes and induce n-type inversion at the surface of handle substrates. The width of the depletion region may be between about 5 micrometers and about 10 micrometers. The inversion layer is several orders on magnitude thinner. See FIG. 1 for a depiction of an HR-SOI structure 2 comprising a depletion region 6 and n-type inversion layer 8. As shown in FIG. 1, the HR-SOI structure 2 comprises a semiconductor handle substrate 4, a buried oxide layer (BOX) 10, and a semiconductor device layer 12. Positive charges in the buried oxide layer 10 deplete holes in the depletion region 6 and induce n-type charge inversion 8.

Figure 2:
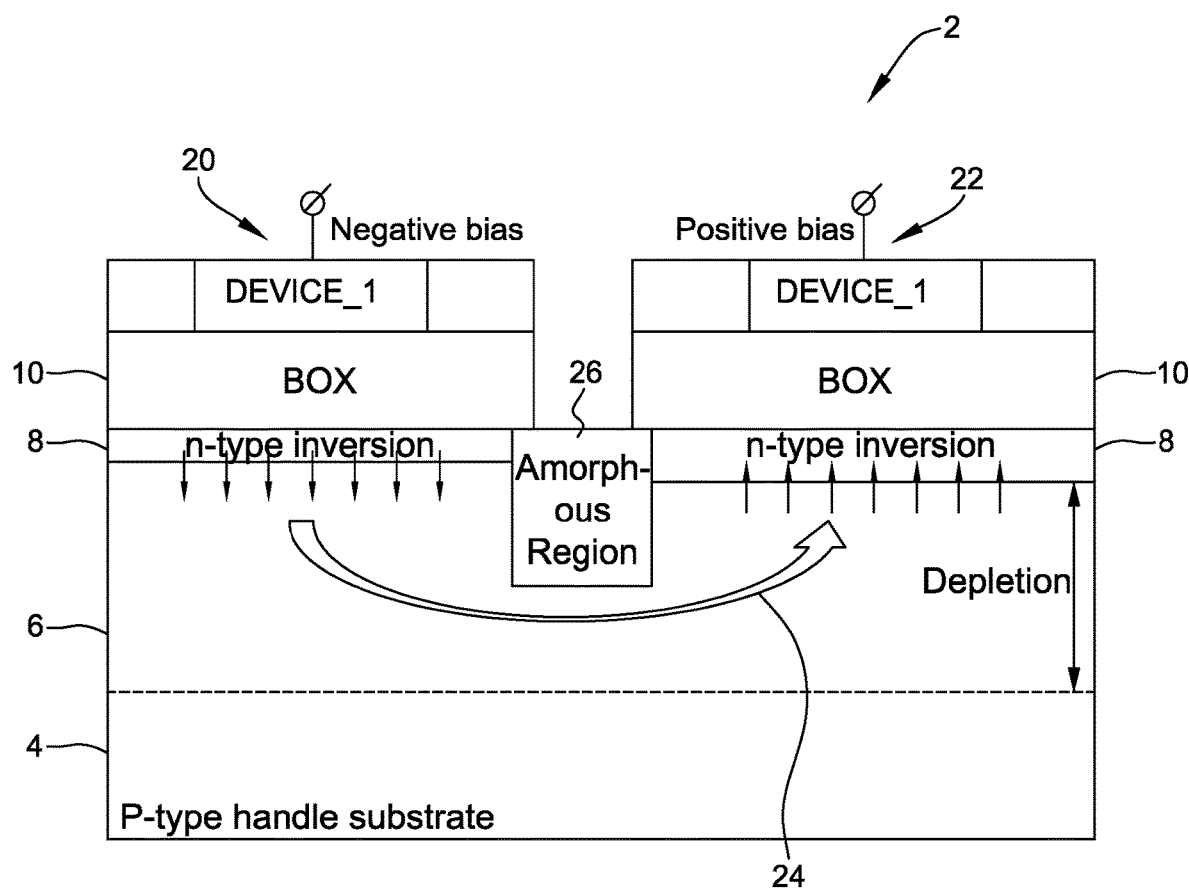
FIG. 2 is a depiction of an HR-SOI structure comprising a depletion layer and a n-type inversion region and further comprising devices in operation.
Figure 3:
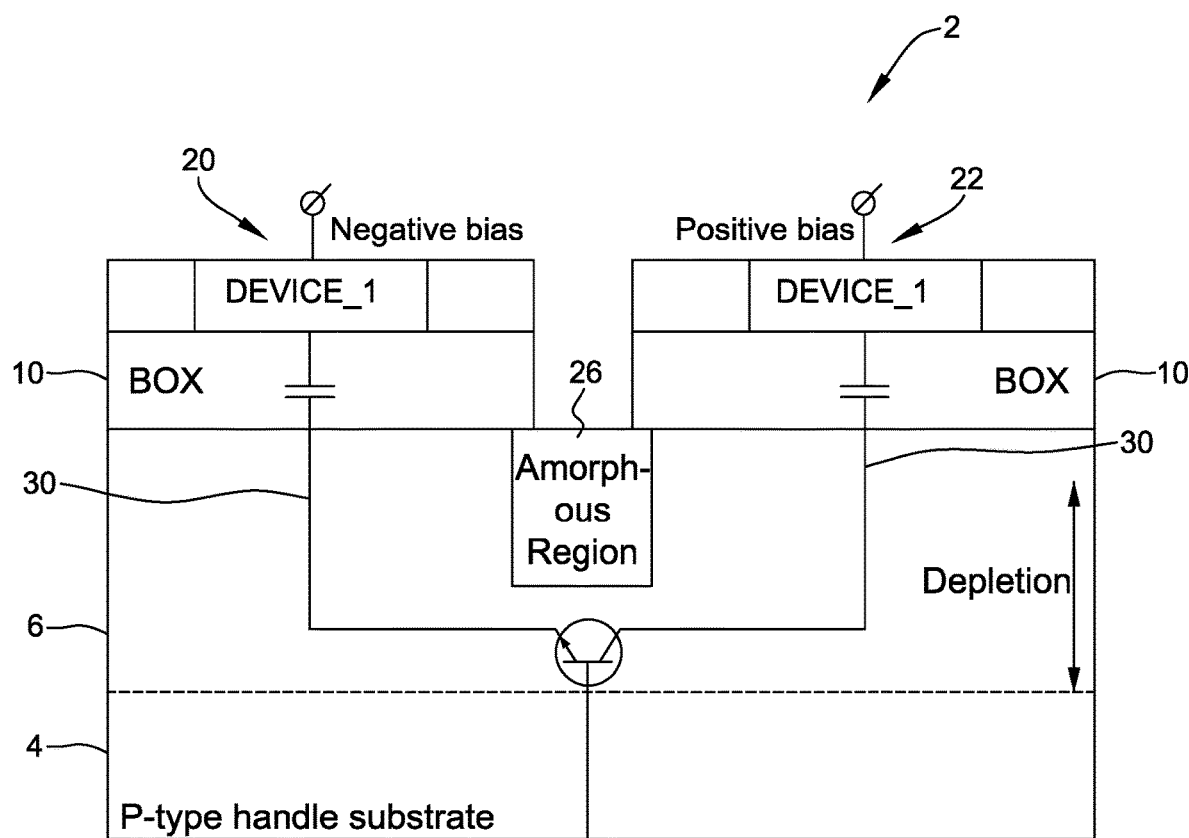
FIG. 3 is a depiction of an HR-SOI structure comprising devices in operation, which depicts an effective bipolar coupling between RF devices through the depletion layer.

With reference to FIGS. 1 and 2, during a dynamic process of RF device 20, 22 operation, at a particular instance, a voltage potential of a device 20 is altered to negative, while another device 22 is biased positively. The n-type inversion layer 8 is a readily available source of electrons. Under those devices 20 with negative bias, the n-type inversion layer 8 injects electrons into the depletion layer 6. Under positively biased devices 22, an electric field 24 is established such that the related n-type inversion layer 8 collects electrons from the depletion layer 6. Even if the structure 2 comprises an amorphous region 26 that separates n-type inversion layer 8 in the semiconductor handle substrate 4 under devices 20, 22 to be isolated from each other, an effective bipolar coupling 30 occurs through the thick depletion layer 6 between the devices 20, 22. See FIG. 3.

The present invention provides an SOI structure that eliminates the bipolar coupling between RF devices via trench isolation extend into handle substrates comprising an amorphous region. This is achieved by a thin isolation layer in the handle substrate near its surface. The isolation layer may be based on any of p/n junction, dielectric, or semi-insulating material. The depth of the isolation layer should not exceed the depth of the amorphous regions. The isolation layer should preferably be as thin as possible, yet preserving continuity.

I. Semiconductor Handle Substrate and Semiconductor Donor Substrate

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the single crystal semiconductor donor wafer. The semiconductor device layer may be transferred onto the semiconductor handle substrate by wafer thinning techniques such as etching a semiconductor donor substrate or by cleaving a semiconductor donor substrate comprising a damage plane.

Figure 4:
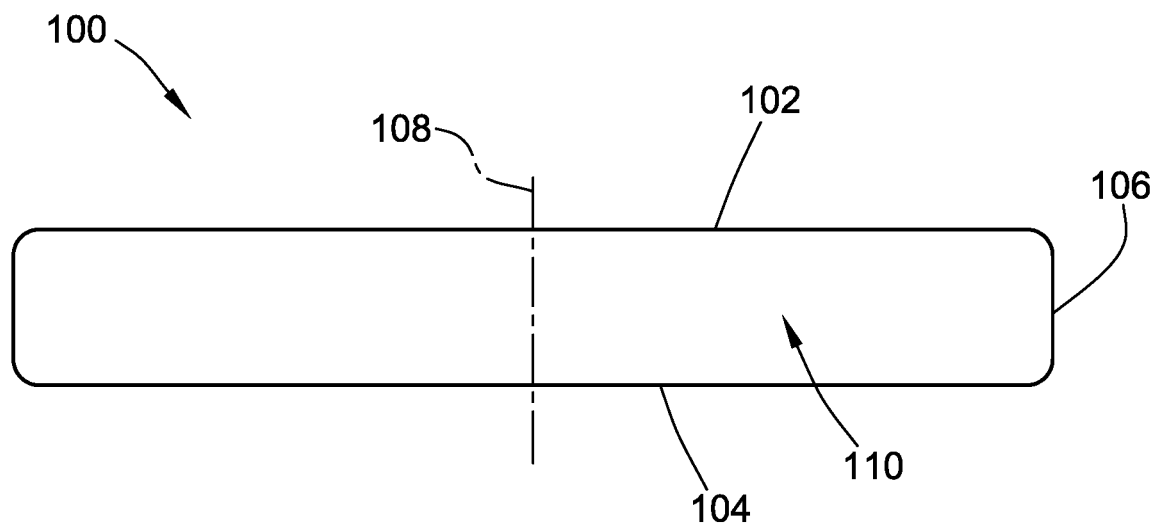
FIG. 4 depicts a single crystal semiconductor handle substrate.

With reference to FIG. 4, an exemplary, non-limiting single crystal semiconductor handle wafer 100 is depicted. In general, the single crystal semiconductor handle wafer 100 comprises two major, generally parallel surfaces. One of the parallel surfaces is a front surface 102 of the single crystal semiconductor handle wafer 100, and the other parallel surface is a back surface 104 of the single crystal semiconductor handle wafer 100. The single crystal semiconductor handle wafer 100 comprises a circumferential edge 106 joining the front and back surfaces 102, 104. The single crystal semiconductor handle wafer 100 comprise a central axis 108 perpendicular to the two major, generally parallel surfaces 102, 104 and also perpendicular to a central plane defined by the points midway between the front and back surfaces 102, 104. The single crystal semiconductor handle wafer 100 comprises a bulk region 110 between the two major, generally parallel surfaces 102, 104. Since semiconductor wafers, e.g., silicon wafers, typically have some total thickness variation (TTV), warp, and bow, the midpoint between every point on the front surface 102 and every point on the back surface 104 may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface 102 and the back surface 104 of the single crystal semiconductor handle wafer 100 may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle wafer 100, e.g., a single crystal silicon handle wafer, refers to the major surface of the substrate that becomes an interior surface of the bonded structure. Accordingly, a "back surface" of a single crystal semiconductor handle wafer 100, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., Handbook of Semiconductor Silicon Technology, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In some embodiments, the single crystal semiconductor wafers, i.e., single crystal semiconductor handle wafer and single crystal semiconductor donor wafer, comprise interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 10 PPMA. Interstitial oxygen may be measured according to SEMI MF 1188-1105.

The single crystal semiconductor handle wafer 100 may have any resistivity obtainable by the Czochralski or float zone methods. Accordingly, the resistivity of the single crystal semiconductor handle wafer 100 is based on the requirements of the end use/application of the structure of the present invention. The resistivity may therefore vary from milliohm or less to megaohm or more. In some embodiments, the single crystal semiconductor handle wafer 100 comprises a p-type or an n-type dopant. Suitable dopants include boron (p type), gallium (p type), phosphorus (n type), antimony (n type), and arsenic (n type). The dopant concentration is selected based on the desired resistivity of the handle wafer. In some embodiments, the single crystal semiconductor handle substrate comprises a p-type dopant.

In some embodiments, the single crystal semiconductor handle substrate is a single crystal silicon wafer comprising a p-type dopant, such as boron.

In some embodiments, the single crystal semiconductor handle wafer 100 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle substrate 100 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), aluminum (p type), indium (p type), phosphorus (n type), antimony (n type), and arsenic (n type).

In some embodiments, the single crystal semiconductor handle wafer 100 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor handle substrate has a bulk resistivity between about 1000 Ohm-cm and about 6,000 Ohm-cm. In some preferred embodiments, the single crystal semiconductor handle substrate comprises an electrically active dopant selected from the group consisting of boron, aluminum, gallium, indium, and any combination thereof. In some preferred embodiments, the single crystal semiconductor handle substrate comprises boron, which may be present in a concentration less than about $2\times10^{13}$ atoms/cm$^3$, less than about $1\times10^{13}$ atoms/cm$^3$, such as less than about $5\times10^{12}$ atoms/cm$^3$, or less than about $1\times10^{12}$ atoms/cm$^3$. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The single crystal semiconductor handle wafer 100 may comprise single crystal silicon. The single crystal semiconductor handle wafer 100 may have any of (100), (110), or (111) crystal orientation, and the choice of crystal orientation may be dictated by the end use of the structure.

Optionally, the front surface 102, the back surface 104, or both may be oxidized according to methods known in the art. Oxidation may be accomplished by means known in the art, such as thermal oxidation (in which some portion of the deposited semiconductor material film will be consumed), CVD oxide deposition, or by exposure to a standard cleaning solution, such as an SC1/SC2 cleaning solution. The oxidation layer on the front surface 102, the back surface 104, or both may be may be at least about 1 nanometer thick, such as between about 10 nanometers and about 5000 nanometers thick, such as between about 100 nanometers and about 1000 nanometers, or between about 200 nanometers and about 400 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

Figure 5A:
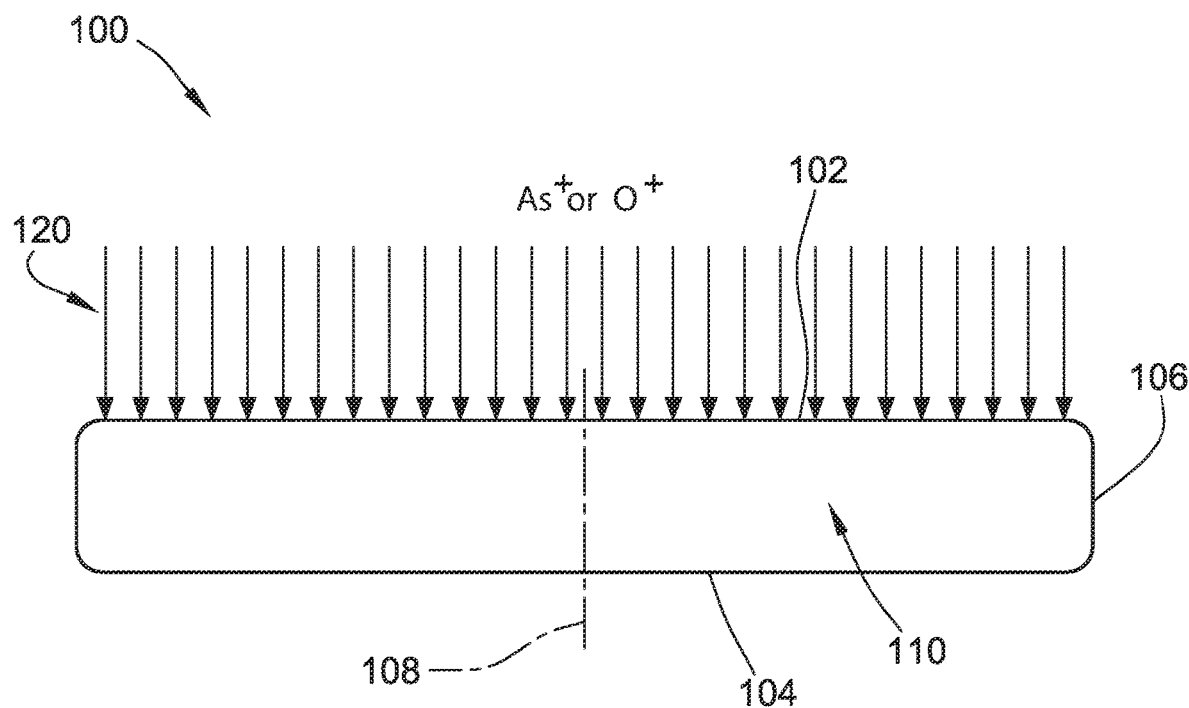
FIGS. 5A and 5B depict a process flow according to some embodiments of the present invention.
Figure 5B:
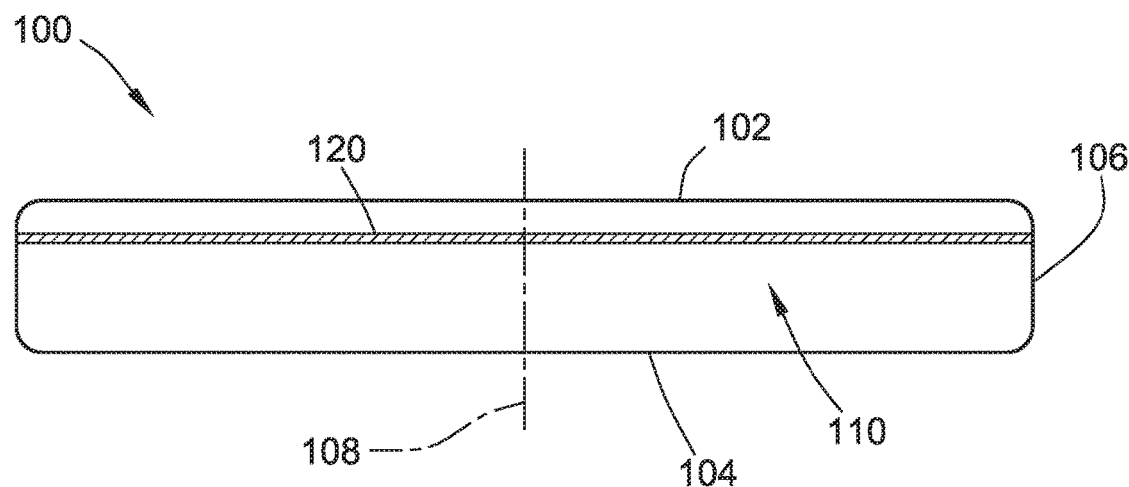

II. Forming an Isolation Region in the Handle Substrate by Arsenic Ion Implantation or by Oxygen Ion Implantation According to some embodiments of the method of the present invention, an isolation region in a single crystal semiconductor handle wafer may be formed by ion implantation. Suitable ions for implantation may include arsenic, e.g., $As^+$, to form an arsenic-doped N+ layer (p/n junction) or oxygen, e.g., $O^+$ and/or $O_2^+$, to form a dielectric or semi-insulating semiconductor oxide layer buried in the handle wafer. In some embodiments, both arsenic, e.g., $As^+$, and oxygen, e.g., $O^+$ or $O_2^+$, are implanted. See FIG. 5A, which depicts ion implantation 120, either $As^+$ ion implantation or $O^+$ ion implantation or both, through a front surface 102 of a single crystal semiconductor handle wafer 100. FIG. 5B depicts a single crystal semiconductor handle wafer 100 comprising an isolation region 120 formed by either $As^+$ ion implantation or $O^+$ ion implantation or both through a front surface 102 of a single crystal semiconductor handle wafer 100.

In some embodiments, arsenic ions, $As^+$, are implanted to form an arsenic-doped N+ layer (p/n junction) as the isolation region. The isolation region 120 therefore comprises arsenic-doped semiconductor. In some embodiments, the single crystal semiconductor handle wafer 100 comprises a single crystal silicon handle wafer, and the isolation region 120 therefore comprises arsenic-doped silicon. Ion implantation may be carried out in a commercially available instrument, such as an Applied Materials Quantum II, a Quantum LEAP, or a Quantum X. Arsenic ions, $As^+$, may be implanted at a dosage between about $1\times10^{12}$ atoms/cm$^2$ to about $5\times10^{14}$ atoms/cm$^2$, such as between about $5\times10^{12}$ atoms/cm$^2$ to about $1\times10^{14}$ atoms/cm$^2$. Arsenic ion implant energies may range from about 1 keV to about 500 keV, such as from about 10 keV to about 100 keV, such as between about 10 keV and about 50 keV, such as about 20 keV. In some embodiments, the $As^+$ ions are implanted to a depth of between about 20 angstroms and about 400 angstroms, such as between about 50 angstroms and about 200 angstroms, as measured from the front surface of the single crystal semiconductor handle substrate toward the central plane. The isolation region 120 should be thinner than the depth of the amorphous region (see FIGS. 9A, 9B, 10A, 10B) so the thickness of the isolation region 120 depends in part upon the configuration of the device, in which the amorphous region may vary in thickness. In some embodiments, the isolation region 120 may be between about 50 angstroms and about 10,000 angstroms thick, or between about 200 angstroms and about 10,000 angstroms thick, such as between about 300 angstroms and about 1000 angstroms, or between about 50 angstroms and about 200 angstroms. In some embodiments, the isolation region may have a resistivity between about $0.25\times10^6$ ohm cm and about $1\times10^{14}$ ohm cm, such as between about $1\times10^{12}$ ohm cm and about $1\times10^{14}$ ohm cm.

In some embodiments, oxygen ions, e.g., $O^+$ and/or $O_2^+$, are implanted to form a semi-insulating or dielectric layer as the isolation region. The isolation region 120 therefore comprises semiconductor oxide. In some embodiments, the single crystal semiconductor handle wafer 100 comprises a single crystal silicon handle wafer, and the isolation region 120 therefore comprises silicon dioxide. Ion implantation may be carried out in a commercially available instrument, such as an Applied Materials Quantum II, a Quantum LEAP, or a Quantum X. Oxygen ions, $O^+$ and/or $O_2^+$, may be implanted at a dosage between about $5\times10^{14}$ atoms/cm$^2$ to about $5\times10^{17}$ atoms/cm$^2$, such as between about $1\times10^{15}$ atoms/cm$^2$ to about $1\times10^{17}$ atoms/cm$^2$. Oxygen ion implant energies may range from about 1 keV to about 200 keV, such as from about 5 keV to about 50 keV, such as between about 5 keV and about 20 keV, such as about 10 keV. In some embodiments, the $O^+$ and/or $O_2^+$ ions are implanted to a depth of between about 20 angstroms and about 400 angstroms, such as between about 50 angstroms and about 200 angstroms, as measured from the front surface of the single crystal semiconductor handle substrate toward the central plane. The isolation region 120 should be thinner than the depth of the amorphous region (see FIGS. 9A, 9B, 10A, 10B) so the thickness of the isolation region 120 depends in part upon the configuration of the device, in which the amorphous region may vary in thickness. In some embodiments, the isolation region 120 may be between about 50 angstroms and about 10,000 angstroms thick, or between about 200 angstroms and about 10,000 angstroms thick, such as between about 300 angstroms and about 1000 angstroms, or between about 50 angstroms and about 200 angstroms. In some embodiments, the isolation region may have a resistivity between about $0.25\times10^6$ ohm cm and about $1\times10^{14}$ ohm cm, such as between about $1\times10^{12}$ ohm cm and about $1\times10^{14}$ ohm cm.

In some embodiments, the ion implantation method advantageously disrupts the crystallinity of the front surface region of the handle substrate, the front surface region being defined as the region between the front surface 102 of the handle substrate 100 and the isolation layer 120. See FIG. 5B. Accordingly, the front surface region of the handle substrate may comprise polycrystalline semiconductor or amorphous semiconductor. Polycrystalline semiconductor, e.g., polycrystalline silicon, denotes a material comprising small silicon crystals having random crystal orientations. Polycrystalline semiconductor, e.g., polycrystalline silicon, grains may be as small in size as about 20 nanometers. The polycrystalline semiconductor, e.g., polycrystalline silicon, grains may be as large as 1000 nanometers. In some embodiments, the polycrystalline semiconductor, e.g., polycrystalline silicon, grains may have an average size between about 20 nanometers and about 500 nanometers. Amorphous semiconductor, e.g., amorphous silicon, comprises a non-crystalline allotropic form of silicon, which lacks short range and long range order. Semiconductor, e.g., silicon, grains having crystallinity over no more than about 10 nanometers may also be considered essentially amorphous.

Figure 6A:
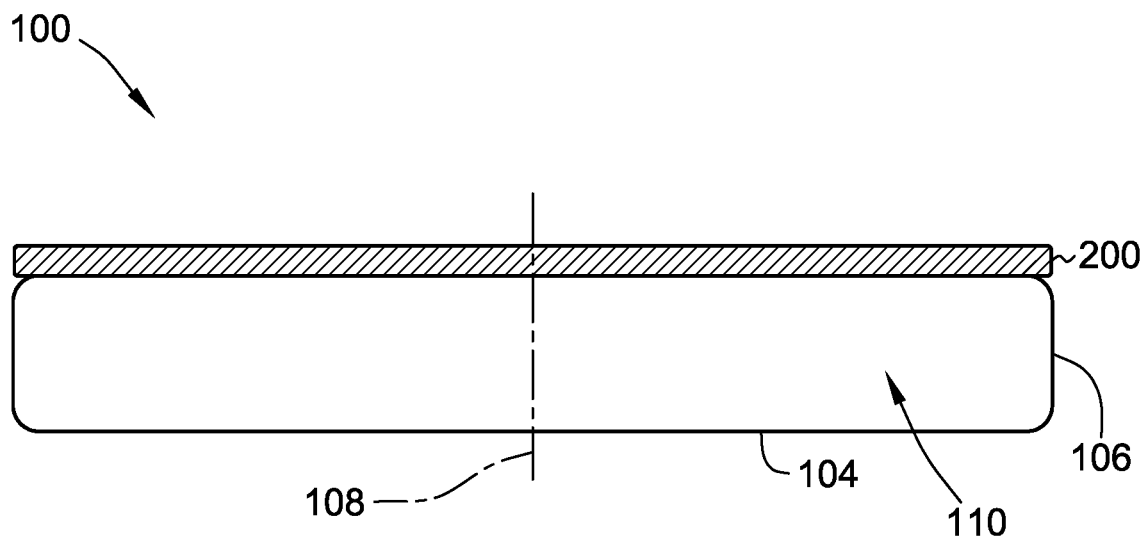
FIGS. 6A and 6B depict a process flow according to some embodiments of the present invention.

III. Forming an Isolation Region in the Handle Substrate by Thermal Oxide Film Deposition According to some embodiments of the method of the present invention, an isolation region in a single crystal semiconductor handle wafer may be formed by growth of an oxide region, following by growth a semiconductor material. See FIG. 6A and FIG. 6B for a depiction of the growth of an isolation region 200 comprising semiconductor oxide by oxidation of the single crystal semiconductor handle wafer 100. Oxidation of the single crystal semiconductor handle wafer 100 may be accomplished by means known in the art, such as thermal oxidation (in which some portion of the deposited semiconductor material film will be consumed) or CVD oxide deposition.

In general, a thermal oxidation method oxidizes both the front surface and the back surface of a single crystal semiconductor handle wafer 100 or single crystal semiconductor donor wafer, unless a masking technique is employed to inhibit oxidation of a side, or a portion of a side, of a wafer. In some embodiments, oxidation of both the front side and the back side of a wafer is advantageous to offset compressive stresses that may otherwise result in wafer bow for a wafer having an oxidation layer on only one side of the wafer. In some embodiments, the single crystal semiconductor handle substrate 100, e.g., a single crystal silicon handle wafer, may be thermally oxidized in a furnace such as an ASM A400 or ASM A400XT. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprise a mixture of inert gas, such as Ar or $N_2$, and oxidizing gases, such as $O_2$ and water vapor (a "wet oxidation"). Optionally, the ambient atmosphere may contain hydrochloric acid, e.g., up to about 10 volume %, to remove surface impurities during oxidation. In an exemplary embodiment, single crystal semiconductor handle wafer 100 may be loaded into a vertical furnace, such as an ASM A400 or ASM A400XT. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. The oxidation layer 200 may be between about 20 angstroms and about 400 angstroms thick, such as between 50 angstroms and about 200 angstroms. In thermal oxidation methods in which both the front and back surfaces are oxidized, the silicon dioxide layers are generally the same thicknesses front and back, although techniques may be used, such as etching or polishing, to vary the thicknesses.

In some embodiments, the front surface, the back surface, or both the front and back surfaces of the single crystal semiconductor handle wafer 100 may be oxidized by a chemical vapor deposition process, such as plasma enhanced chemical vapor deposition or low pressure chemical vapor deposition. The oxidation layer 200 may be between about 20 angstroms and about 400 angstroms thick, such as between 50 angstroms and about 200 angstroms.

Plasma enhanced chemical vapor deposition may occur in a commercially available tool, such as those available from EV Group, such as EVG®810LT Low Temp Plasma Activation System. General requirements of a plasma enhanced CVD chamber include a reactor with various electrode designs, power generation electronics, impedance matching network to transfer power to the gas load, mass flow controllers for input gasses, and pressure control systems. Typical systems are vertical tube reactors powered by an inductively coupled RF source. The single crystal semiconductor handle wafer 100 and/or donor wafer is loaded into the chamber and placed on a heated support chamber. The chamber is evacuated and backfilled with an oxygen gas source in a carrier gas, such as argon, to a pressure less than atmospheric to thereby create the plasma. Oxygen and/or water are suitable source gases for plasma oxide treatment. To deposit a silicon nitride or a silicon dioxide plasma film, suitable silicon precursors include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), tetra-ethyl orthosilicate ($Si(OCH_2CH_3)_4$), among others. Plasma deposition may occur at a temperature between about 20° C. and about 400° C. The flow rate ratios of the gaseous silicon precursor and the gaseous oxygen precursor may be between about 1/200 and about 1/50, such as about 1/100.

The LPCVD process can be done in a cold or hot walled quartz tube reactor. Hot walled furnaces allow batch processing and therefore high throughput. They also provide good thermal uniformity, and thus result in uniform films. A disadvantage of hot wall systems is that deposition also occurs on the furnace walls, so that frequent cleaning or replacement of the tube is necessary to avoid flaking of the deposited material and subsequent particle contamination. Cold wall reactors are lower maintenance, as there is no film deposition on the reactor walls. The low pressure chemical vapor semiconductor oxide (e.g., silicon dioxide) may be formed at pressures between about 0.01 Torr and about 100 Torr, such as between about 0.1 Torr and about 1 Torr in a low pressure chemical vapor deposition. Temperatures may range between 425° C. and 900° C. Suitable precursors include those listed for PECVD.

Figure 6B:
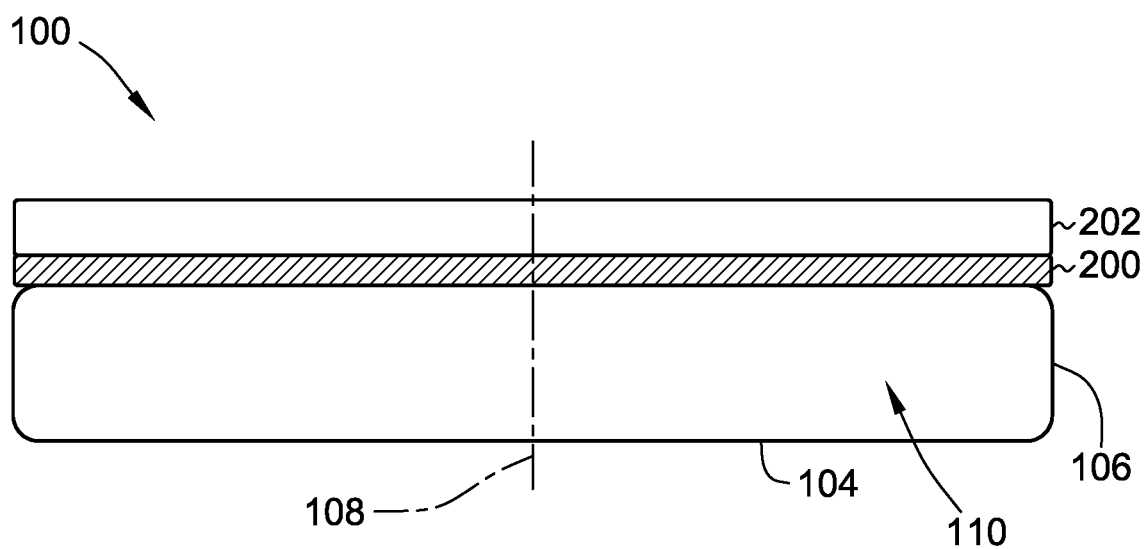

According to the method of the present invention and with reference to FIG. 6B, a polycrystalline or amorphous semiconductor material 202 is deposited onto the oxidation layer 200 of the single crystal semiconductor handle wafer 100. Such materials include polycrystalline semiconductor materials and amorphous semiconductor materials. Materials that may be polycrystalline or amorphous include silicon (Si), silicon germanium (SiGe), silicon doped with carbon (SiC), and germanium (Ge). Polycrystalline silicon denotes a material comprising small silicon crystals having random crystal orientations. Polycrystalline silicon grains may be as small in size as about 20 nanometers. The polycrystalline silicon grains may be as large as 1000 nanometers. In some embodiments, the polycrystalline silicon grains may have an average size between about 20 nanometers and about 500 nanometers. According to the method of the present invention, the smaller the crystal grain size of polycrystalline silicon deposited the higher the defectivity in the charge trapping layer. Amorphous silicon comprises a non-crystalline allotropic form of silicon, which lacks short range and long range order. Silicon grains having crystallinity over no more than about 10 nanometers may also be considered essentially amorphous.

The material for deposition onto the oxidation layer 200 of the single crystal semiconductor handle wafer 100 may be deposited by means known in the art. For example, the semiconductor material may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), silicon tetrachloride ($SiCl_4$), among others. For example, polycrystalline silicon may be deposited onto the oxidation layer 200 of the single crystal semiconductor handle wafer 100 by pyrolyzing silane ($SiH_4$) in a temperature range between about 550° C. and about 690° C., such as between about 580° C. and about 650° C. The chamber pressure may range from about 70 to about 400 mTorr. Amorphous silicon may be deposited by plasma enhanced chemical vapor deposition (PECVD) at temperatures generally ranging between about 75° C. and about 300° C. The overall thickness of the polycrystalline or amorphous semiconductor material 202 may be between about 50 nanometers and about 4000 nanometers, such as between about 100 nanometers and about 2000 nanometers.

Figure 7A:
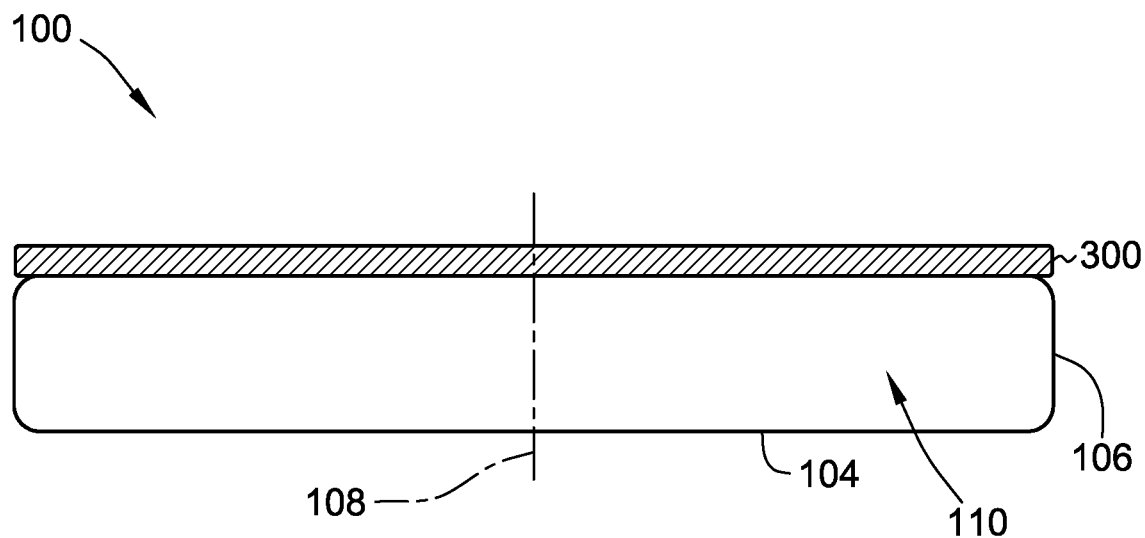
FIGS. 7A and 7B depict a process flow according to some embodiments of the present invention.

V. Forming an Isolation Region in the Handle Substrate by Epitaxial Deposition of Arsenic Doped Layer According to some embodiments of the method of the present invention, an isolation region in a single crystal semiconductor handle wafer 100 may be formed by epitaxial deposition of an arsenic-doped silicon layer, following by epitaxial deposition of a semiconductor material. See FIG. 7A and FIG. 7B for a depiction of the growth of an isolation region 300 comprising arsenic-doped silicon by epitaxial deposition of such a layer on the front surface of the single crystal semiconductor handle wafer 100. Epitaxially deposited material matches the crystalline order of the underlying substrate. Epitaxial deposition may occur by chemical vapor deposition (CVD), low pressure chemical vapor deposition (LPCVD), plasma enhanced chemical vapor deposition (PECVD), or molecular beam epitaxy (MBE). Epitaxial deposition may occur by vapor phase or liquid phase deposition. Silicon precursors for epitaxial deposition include methyl silane, silicon tetrahydride (silane), trisilane, disilane, pentasilane, neopentasilane, tetrasilane, dichlorosilane ($SiH_2Cl_2$), silicon tetrachloride ($SiCl_4$), among others. Arsenic precursors for epitaxial deposition include alkyl arsines, such as mono 1-methylethylarsine, mono 1-methylpropylarsine, mono 1,1-dimethylethylarsine, mono 1-methylbutylarsine, mono 1,1-dimethylpropylarsine, mono 1,1-dimethylbutylarsine, mono 1,1-diethylethylarsine, mono 1,1,2-trimethylpropylarsine, mono 1,1,3,3-tetramethylbutylarsine, mono 1-methylheptylarsine, mono 1-methylnonylarsine, mono α-methylbenzylarsine, mono α, α-dimethylbenzylarsine, mono α-methyl(4-methylbenzyl)arsine, bis(1-methylethyl)arsine, bis(1-methylpropyl)arsine, bis(1,1-dimethylethyl)arsine, bis(1-methylbutyl)arsine, bis(1,1-dimethylpropyl)arsine, bis(1,1-dimethylbutyl)arsine, bis(1, 1,3,3,-tetramethylbutyl)arsine, bis(α-methylbenzyl) arsine and the like. The isolation region 300 comprising arsenic doped silicon may be between about 20 angstroms and about 400 angstroms thick, such as between 50 angstroms and about 200 angstroms. In some embodiments, the isolation region may have a resistivity between about $0.25 \times 10^6$ ohm cm and about $1 \times 10^{14}$ ohm cm, such as between about $1 \times 10^{12}$ ohm cm and about $1 \times 10^{14}$ ohm cm.

Figure 7B:
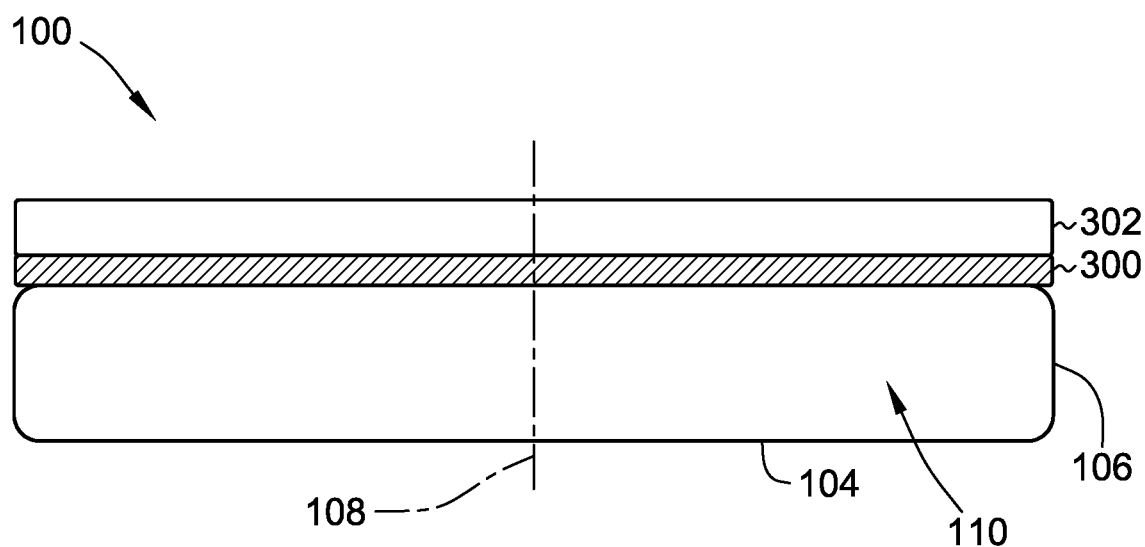

Following deposition of the isolation region 300 comprising arsenic doped silicon, the flow of the arsenic precursor is stopped, and epitaxial deposition continues with only the silicon precursor to thereby deposit an epitaxial silicon layer. With reference to FIG. 7B, epitaxial deposition continues until an epitaxial silicon layer 302 is deposited having a thickness between about 50 nanometers and about 4000 nanometers, such as between about 100 nanometers and about 2000 nanometers.

VI. Deposition of Semiconductor Oxide on Handle Substrate

Figure 8A:
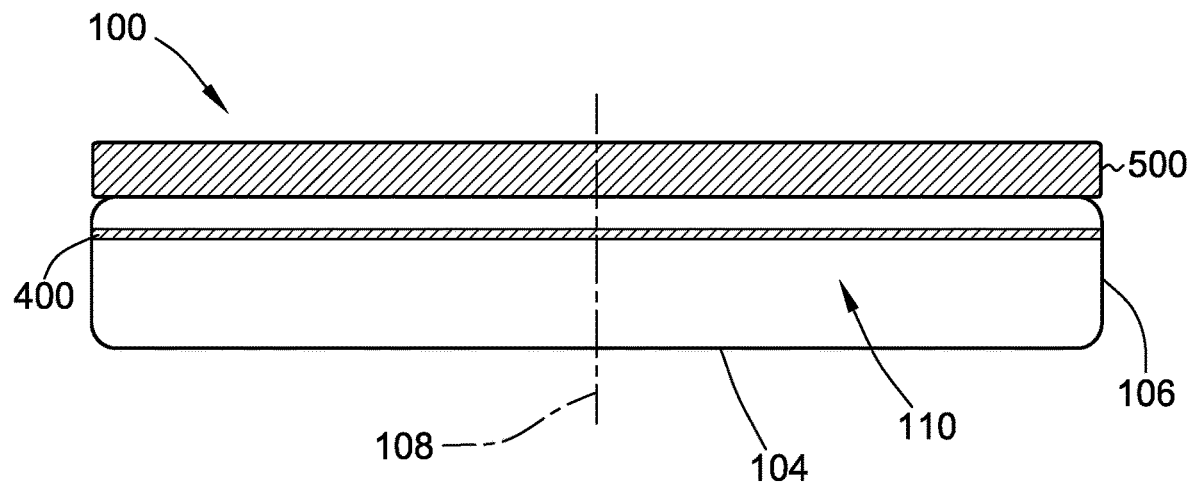
FIGS. 8A, 8B, and 8C depict a process flow according to some embodiments of the present invention.
Figure 8B:
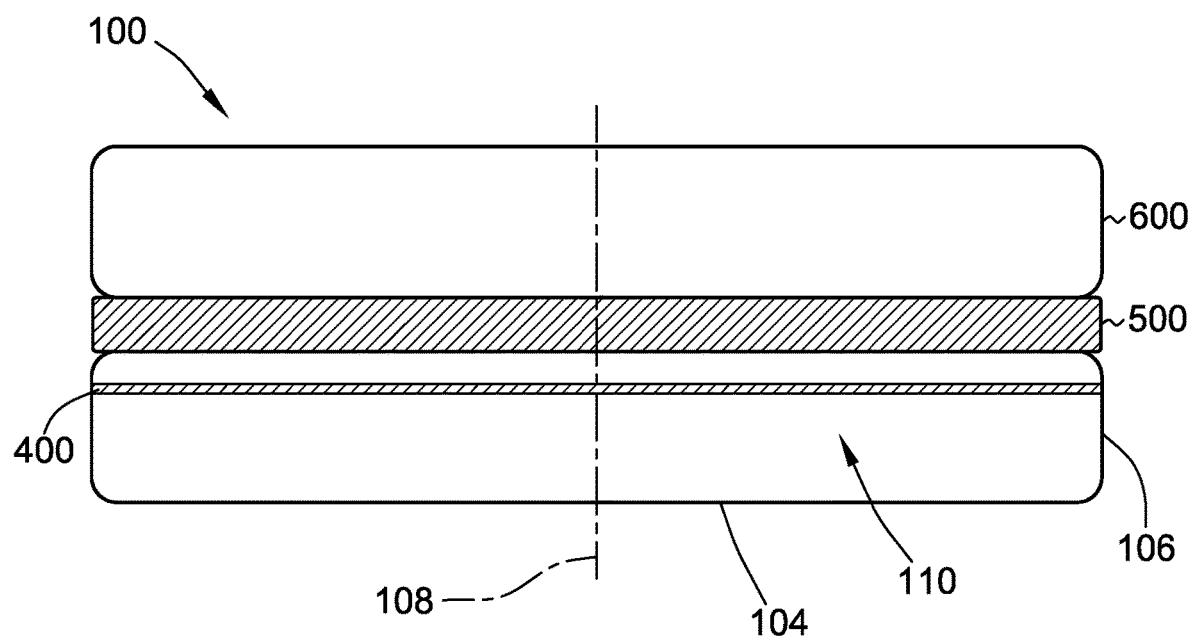

In some embodiments and with reference to FIGS. 8A and 8B, a dielectric layer 500 is deposited on the front surface 102 of the single crystal semiconductor handle substrate 100. The dielectric layer 500 may comprise a material selected from the group consisting of silicon dioxide, silicon oxynitride, silicon nitride, hafnium oxide, titanium oxide, zirconium oxide, lanthanum oxide, barium oxide, and a combination thereof. In some embodiments, the dielectric layer 500 comprises a buried oxide layer having a thickness of at least about 10 nanometer thick, such as between about 10 nanometers and about 10,000 nanometers, between about 10 nanometers and about 5,000 nanometers, or between about 100 nanometers and about 400 nanometers.

In some embodiments and with reference to FIGS. 8A and 8B, the front surface of the single crystal semiconductor handle substrate 100 (e.g., a silicon wafer) comprising the isolation region 400 is oxidized to form a dielectric layer 500 (a semiconductor oxide layer, e.g., a silicon dioxide layer) on the front surface 102 of the single crystal semiconductor handle substrate 100. The isolation region 400 is prepared according to one of the methods set forth herein above. The dielectric layer 500 (a semiconductor oxide layer, e.g., a silicon dioxide layer) is suitable as a buried oxide layer in the manufacture of a semiconductor-on-insulator structure (e.g., silicon-on-insulator) comprising a single crystal semiconductor handle substrate 100 comprising an isolation region 400, a semiconductor oxide (e.g., silicon dioxide) layer 500, and a single crystal semiconductor device layer. In order to form a semiconductor oxide layer 500 (e.g., a silicon dioxide layer), the front surface of the single crystal semiconductor handle substrate 100 (e.g., a silicon wafer) is oxidized. This may be accomplished by means known in the art, such as thermal oxidation (in which some portion of the deposited semiconductor material film will be consumed) or CVD oxide deposition.

In some embodiments, the single crystal semiconductor handle substrate 100, e.g., a single crystal silicon handle wafer, comprising the isolation region 400 may be thermally oxidized in a furnace such as an ASM A400 or ASM A400XT. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprise a mixture of inert gas, such as Ar or $N_2$, and oxidizing gases, such as $O_2$ and water vapor (a "wet oxidation"). Optionally, the ambient atmosphere may contain hydrochloric acid, e.g., up to about 10 volume %, to remove surface impurities during oxidation. In an exemplary embodiment, the single crystal semiconductor handle substrate 100 may be loaded into a vertical furnace, such as an ASM A400 or ASM A400XT. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. In some embodiments, the semiconductor oxide layer 500 (e.g., a silicon dioxide layer), is formed on the front surface of the single crystal semiconductor handle substrate 100 to an average depth D1 between about 10 nanometers and about 10,000 nanometers, between about 10 nanometers and about 5,000 nanometers, or between about 100 nanometers and about 400 nanometers.

In some embodiments, the semiconductor oxide layer 500 maybe deposited onto the single crystal semiconductor handle substrate 100, e.g., a single crystal silicon handle wafer, comprising the isolation region 400 by CVD. Suitable techniques include metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), silicon tetrachloride ($SiCl_4$), among others. Oxygen may be provided by oxygen or ozone. Silicon oxide may be deposited onto the front surface of the single crystal semiconductor handle substrate 100 by pyrolyzing silane ($SiH_4$) and oxygen in a temperature range between about 550° C. and about 690° C., such as between about 580° C. and about 650° C. The chamber pressure may range from about 70 to about 400 mTorr. In some embodiments, the semiconductor oxide layer 500 (e.g., a silicon dioxide layer), is formed by CVD on the front surface of the single crystal semiconductor handle substrate 100 to an average depth D1 between about 10 nanometers and about 10,000 nanometers, between about 10 nanometers and about 5,000 nanometers, or between about 100 nanometers and about 400 nanometers.

After oxidation, wafer cleaning is optional. If desired, the wafer can be cleaned, for example, in a standard SC1/SC2 solution.

VII. Wafer Bonding

Figure 8C:
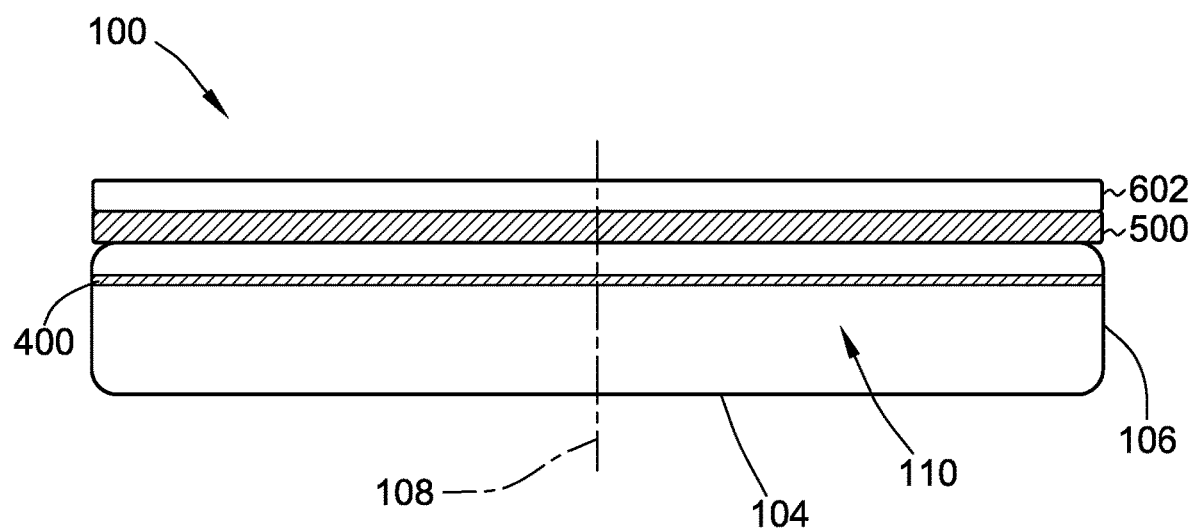

With reference to FIGS. 8A, 8B, and 8C, the single crystal semiconductor handle substrate 100, e.g. a single crystal semiconductor handle wafer such as a single crystal silicon handle wafer, prepared according to the method described herein comprising an isolation region 400 and a dielectric layer 500 is next bonded to a semiconductor donor substrate 600, e.g., a single crystal semiconductor donor wafer, which is prepared according to conventional layer transfer methods. The single crystal semiconductor donor substrate 600 may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer 600 may comprise electrically active dopants, such as boron (p type), gallium (p type), aluminum (p type), indium (p type), phosphorus (n type), antimony (n type), and arsenic (n type). In some embodiments, the donor wafer may comprise a combination of p type dopants. In some embodiments, the donor wafer may comprise a combination of n type dopants. In some embodiments, the donor wafer may comprise a combination of p type dopants and n type dopants. The resistivity of the single crystal semiconductor (e.g., silicon) donor wafer may range from 1 to 50 Ohm-cm, typically, from 5 to 25 Ohm-cm. The single crystal semiconductor donor wafer may be subjected to standard process steps including oxidation, implant, and post implant cleaning. Accordingly, a single crystal semiconductor donor substrate 600 (e.g., a single crystal semiconductor donor wafer), such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the single crystal semiconductor donor substrate 600 comprises a dielectric layer. The dielectric layer may comprise one or more insulating layers formed on the front surface of the single crystal semiconductor donor wafer 600. The dielectric layer according to the present invention may comprise insulating materials selected from among silicon dioxide, silicon nitride, silicon oxynitride, hafnium oxide, titanium oxide, zirconium oxide, lanthanum oxide, barium oxide, and any combination thereof. In some embodiments, the dielectric layer comprises one or more insulating layers comprising a material selected from the group consisting of silicon dioxide, silicon nitride, silicon oxynitride, and any combination thereof. In some embodiments, the dielectric layer has a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the dielectric layer comprises multiple layers of insulating material. The dielectric layer may comprise two insulating layers, three insulating layers, or more. Each insulating layer may comprise a material selected from among silicon dioxide, silicon oxynitride, silicon nitride, hafnium oxide, titanium oxide, zirconium oxide, lanthanum oxide, barium oxide, and any combination thereof. In some embodiments, each insulating layer may comprise a material selected from the group consisting of silicon dioxide, silicon nitride, siliconoxynitride, and any combination thereof. Each insulating layer may have a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the front surface of the single crystal semiconductor donor substrate 600 (e.g., a single crystal silicon donor substrate) may be thermally oxidized (in which some portion of the deposited semiconductor material film will be consumed) to prepare the semiconductor oxide film, or the semiconductor oxide (e.g., silicon dioxide) film may be grown by CVD oxide deposition. In some embodiments, the front surface of the single crystal semiconductor donor substrate 600 may be thermally oxidized in a furnace such as an ASM A400 or ASM A400XT in the same manner described above. In some embodiments, the donor substrates are oxidized to provide an oxide layer on the front surface layer of at least about 1 nanometer thick, such as between about 10 nanometers and about 5000 nanometers thick, such as between about 100 nanometers and about 1000 nanometers, or between about 200 nanometers and about 400 nanometers. In some embodiments, the oxidation layer is relatively thin, such as between about 5 angstroms and about 25 angstroms, such as between about 10 angstroms and about 15 angstroms.

Ion implantation may be carried out in a commercially available instrument, such as an Applied Materials Quantum II, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines the thickness of the single crystal semiconductor device layer in the final SOI structure. The ions may be implanted to a depth between about 100 angstroms and about 30,000 angstroms, such as between about 200 angstroms and about 20,000 angstroms, such as between about 2000 angstroms and about 15,000 angstroms, or between about 15,000 angstroms and about 30,000 angstroms. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate 600 having an ion implant region therein formed by $He^+$, $H^+$, $H_2^+$, and any combination thereof ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 350° C., preferably about 350° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ or $N_2$ to a pressure less than atmospheric to thereby create the plasma. The single crystal semiconductor donor wafer is exposed to this plasma for the desired time, which may range from about 1 second to about 120 seconds. Oxygen or nitrogen plasma surface oxidation is performed in order to render the front surface of the single crystal semiconductor donor substrate hydrophilic and amenable to bonding to a single crystal semiconductor handle substrate prepared according to the method described above. After plasma activation, the activated surface is rinsed with deionized water. The wafer is then spun dry prior to bonding.

The hydrophilic front surface layer of the single crystal semiconductor donor substrate 600 and the dielectric layer 500 in contact with the single crystal semiconductor handle substrate 100 are next brought into intimate contact to thereby form a bonded structure. See FIG. 8B The bonded structure comprises a dielectric layer 500, e.g., a buried oxide, between the single crystal semiconductor handle substrate 100 comprising the isolation region 400 and the single crystal semiconductor donor substrate 600. A portion of the dielectric layer 500 is contributed by the oxidized front surface of the single crystal semiconductor handle substrate 100 and, optionally, a portion of the dielectric layer contributed by the oxidized front surface of the single crystal semiconductor donor substrate 600. In some embodiments, the dielectric layer 500 comprises a buried oxide layer having a thickness of at least about 10 nanometer thick, such as between about 10 nanometers and about 10,000 nanometers, between about 10 nanometers and about 5,000 nanometers, or between about 100 nanometers and about 400 nanometers.

Since the mechanical bond is relatively weak, the bonded structure may be further annealed to solidify the bond between the single crystal semiconductor donor substrate 600 and the single crystal semiconductor handle substrate 100. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 350° C., preferably about 350° C. Thermal annealing may occur for a duration of from about 0.5 hours to about 10 hour, preferably a duration of about 2 hours. Thermal annealing within these temperatures ranges is sufficient to form a thermally activated cleave plane. After the thermal anneal to activate the cleave plane, the bonded structure may be cleaved.

After the thermal anneal, the bond between the single crystal semiconductor donor substrate 600 and the single crystal semiconductor handle substrate 100 is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a single crystal semiconductor device layer 602, preferably a silicon device layer, on the semiconductor-on-insulator composite structure. See FIG. 8C.

After cleaving, the cleaved structure may be subjected to a high temperature anneal in order to further strengthen the bond between the transferred device layer 602 and the single crystal semiconductor handle substrate 100. An example of a suitable tool might be a vertical furnace, such as an ASM A400 or ASM A400XT. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor device layer 602 may be brought to the desired thickness and smoothness by subjecting to a vapor phase HCl etch process in a horizontal flow single wafer epitaxial reactor using $H_2$ as a carrier gas. In some embodiments, the semiconductor device layer 602 may have a thickness between about 10 nanometers and about 20 micrometers, between about 20 nanometers and about 3 micrometers, such as between about 20 nanometers and about 2 micrometers, such as between about 20 nanometers and about 1.5 micrometers or between about 1.5 micrometers and about 3 micrometers. Thick film device layers may have a device layer thickness between about 1.5 micrometers and about 20 micrometers. Thin film device layers may have a thickness between about 0.01 micrometer and about 0.20 micrometer.

In some embodiments, an epitaxial layer may be deposited on the transferred device layer 602. The epitaxial layer may be deposited onto the entire single crystal semiconductor device layer 602, or, alternatively, onto only a portion of the single crystal semiconductor device layer 602. The surface of the single crystal semiconductor device layer 602 may comprise an oxide layer. For example, a silicon oxide layer forms on a silicon surface when it is exposed to air at room temperature and generally has a thickness of from about 10 to about 15 Å. Preferably, the oxide layer is removed from the surface of the single crystal semiconductor device layer 602 before the epitaxial layer is deposited onto the surface. A deposited epitaxial layer may comprise substantially the same electrical characteristics as the underlying single crystal semiconductor device layer 602. Alternatively, the epitaxial layer may comprise different electrical characteristics as the underlying single crystal semiconductor device layer 602. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise a dopant selected from among boron (p type), gallium (p type), aluminum (p type), indium (p type), phosphorus (n type), antimony (n type), and arsenic (n type). The resistivity of the epitaxial layer may range from 1 to 50 Ohm-cm, typically, from 5 to 25 Ohm-cm. In some embodiments, the epitaxial layer may have a thickness between about 10 nanometers and about 20 micrometers, between about 20 nanometers and about 3 micrometers, such as between about 20 nanometers and about 2 micrometers, such as between about 20 nanometers and about 1.5 micrometers or between about 1.5 micrometers and about 3 micrometers.

The epitaxial deposition preferably is carried out by chemical vapor deposition. Generally speaking, chemical vapor deposition involves exposing the surface of the wafer to an atmosphere comprising silicon in an epitaxial deposition reactor, e.g., a Centura reactor available from Applied Materials. Preferably, the surface of the single crystal semiconductor device layer 602 is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (preferably $H_2$). For example, the source of silicon during the epitaxial deposition may be $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the temperature of the wafer surface preferably is ramped to and maintained at a temperature sufficient to prevent the atmosphere comprising silicon from depositing polycrystalline silicon on the surface. Generally, the temperature of the surface during this period preferably is at least about 900° C. More preferably, the temperature of the surface is maintained in the range of between about 1050 and about 1150° C. Most preferably, the temperature of the surface is maintained at the silicon oxide removal temperature.

The rate of growth of the epitaxial deposition preferably is from about 0.5 to about 7.0 µm/min. A rate of about 3.5 to about 4.0 µm/min may be achieved, for example, by using an atmosphere consisting essentially of about 2.5 mole % SiHCl$_3$ and about 97.5 mole % H$_2$ at a temperature of about 1150° C. and an absolute pressure of up to about 1 atm.

In some applications, the single crystal semiconductor device layer 602 comprises an epitaxial layer which imparts electrical properties. In some embodiments, the epitaxial layer is lightly doped with phosphorous. Therefore, the ambient for epitaxial deposition comprises phosphorous present as a volatile compound, such as, for example, phosphine, PH$_3$. In some embodiments, the epitaxial layer can contain boron. Such a layer may be prepared by, for example, including B$_2$H$_6$ in the atmosphere during the deposition.

Epitaxial deposition typically requires a post-epi cleaning step following epitaxial deposition to remove byproducts formed during the epitaxial deposition. This step is used to prevent time-dependent haze, which results if such byproducts react with air. In addition, many post-epi cleaning techniques tend to form a silicon oxide layer on the epitaxial surface which tends to passivate (i.e., protect) the surface. The epitaxial wafers of the present invention may be cleaned by methods known in the art.

VIII. Structures

The finished SOI wafer comprises the semiconductor handle substrate 100 comprising isolation region 400, the dielectric layer 500 (e.g., buried oxide layer), and the semiconductor device layer 602, and, optionally, an epitaxial layer, may then be subjected to end of line metrology inspections and cleaned a final time using typical SC1-SC2 process.

The present invention provides an SOI structure that eliminates the bipolar coupling between RF devices with trench isolation extended into the handle substrates with amorphous regions. This is achieved by a thin isolation region in the handle substrate near its surface. The isolation layer may be based on either p/n junction or dielectric or semi-insulating material. See FIGS. 9A and 9B, which depicts a structure comprising an isolation region comprising a p/n junction provided by a N+ buried layer. See FIGS. 10A and 10B, which depicts a structure comprising an isolation region comprising a dielectric layer.

Figure 9A:
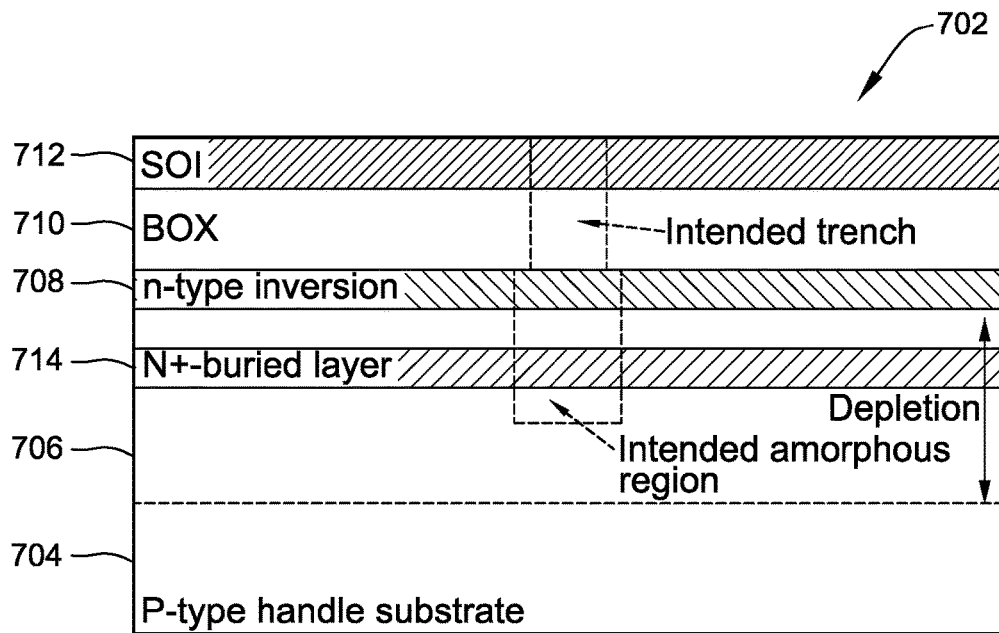
FIGS. 9A and 9B depict a SOI structure comprising an isolation region comprising a p/n junction.
Figure 9B:
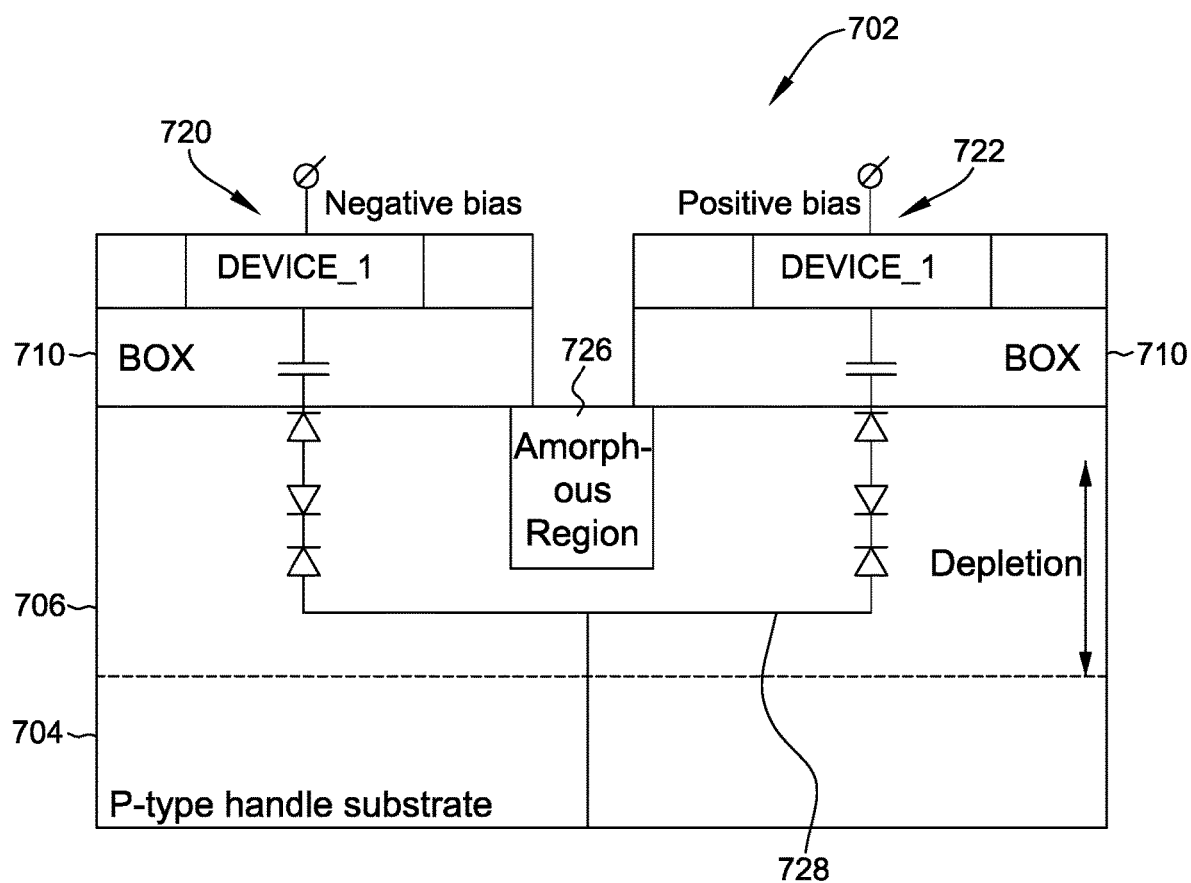

FIGS. 9A and 9B depict an SOI structure 702 comprising an isolation region 714 based on an N+ layer. FIG. 9A depicts of an HR-SOI structure 702 comprising a depletion region 706 and n-type inversion layer 708. As shown in FIG. 9A, the HR-SOI structure 702 comprises a semiconductor handle substrate 704, a buried oxide layer 710, and a semiconductor device layer 712. The semiconductor device layer 712 may be fabricated to comprise RF devices 720, 722. See FIG. 9B. The HR-SOI structure 702 comprises an amorphous region 726 between RF devices 720, 722. Positive charges in the buried oxide layer 710 induce deplete holds in the depletion region 706 and induce n-type charge inversion 708. The HR-SOI structure 702 is prepared according to the method of the present invention to comprise an isolation region 714 based on an N+ layer.

With reference to FIGS. 9A and 9B, during a dynamic process of RF device 720, 722 operation, at a particular instance, a voltage potential of a device 720 is altered to negative, while another device 722 is biased positively. The n-type inversion layer 708 is a readily available source of electrons. Under those devices 720 with negative bias, the n-type inversion layer 708 injects electrons into the depletion layer. Under positively biased devices 722, an electric field is established such that the related-type inversion layer 708 collects electrons from the depletion layer 706. The thin isolation layer 714, based on N+ buried layer, in the handle substrate 704 near its surface eliminates the bipolar coupling 728 between RF devices with trench isolation.

Figure 10A:
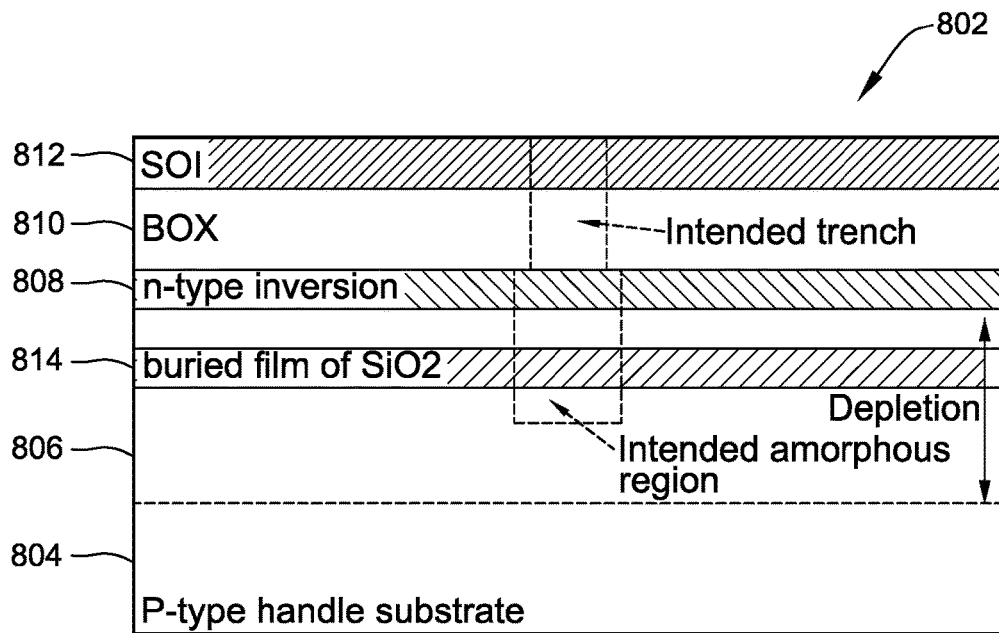
FIGS. 10A and 10B depict a SOI structure comprising an isolation region comprising a dielectric layer.
Figure 10B:
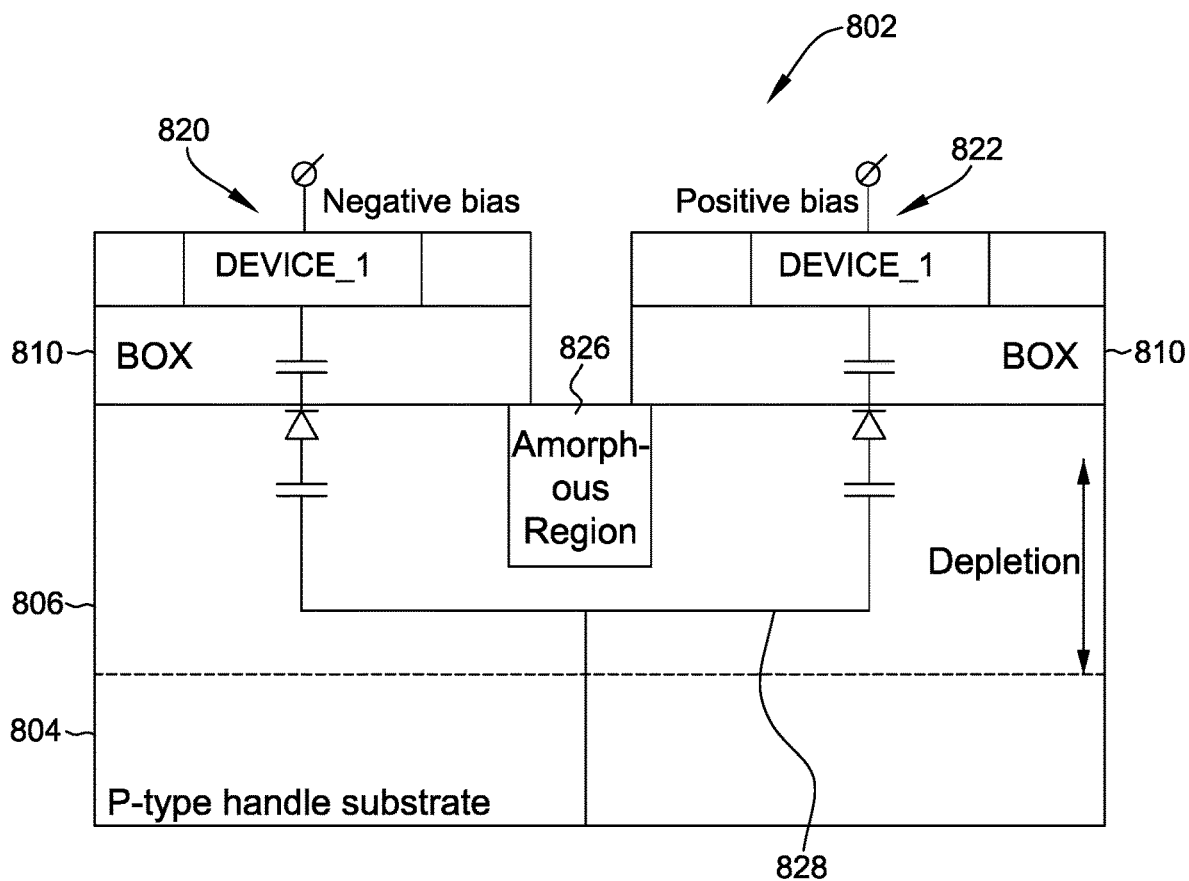

FIGS. 10A and 10B depict an SOI structure 802 comprising an isolation region 814 based on a dielectric layer. FIG. 10A depicts of an HR-SOI structure 802 comprising a depletion region 806 and n-type inversion layer 808. As shown in FIG. 10A, the HR-SOI structure 802 comprises a semiconductor handle substrate 804, a buried oxide layer 810, and a semiconductor device layer 812. The semiconductor device layer 812 may be fabricated to comprise RF devices 820, 822. See FIG. 10B. The HR-SOI structure 802 comprises an amorphous region 826 between RF devices 820, 822. Positive charges in the buried oxide layer 810 induce deplete holds in the depletion region 806 and induce n-type charge inversion 808. The HR-SOI structure 802 is prepared according to the method of the present invention to comprise an isolation region 814 based on a dielectric layer.

With reference to FIGS. 10A and 10B, during a dynamic process of RF device 820, 822 operation, at a particular instance, a voltage potential of a device 820 is altered to negative, while another device 822 is biased positively. The n-type inversion layer 808 is a readily available source of electrons. Under those devices 820 with negative bias, the n-type inversion layer 808 injects electrons into the depletion layer. Under positively biased devices 822, an electric field is established such that the related-type inversion layer 808 collects electrons from the depletion layer 806. The thin isolation layer 814, based on a dielectric layer, in the handle substrate 804 near its surface eliminates the bipolar coupling 828 between RF devices with trench isolation.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of preparing a multilayer structure, the method comprising:

thermally oxidizing a front surface of a single crystal semiconductor handle substrate to thereby grow an oxide layer on the front surface of the single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge of the single crystal semiconductor handle substrate joining the front and back surfaces of the single crystal semiconductor handle substrate, a central plane of the single crystal semiconductor handle substrate between the front surface of the single crystal semiconductor handle substrate and the back surface of the single crystal semiconductor handle substrate, and a bulk region between the front and back surfaces of the single crystal semiconductor handle substrate, wherein the single crystal semiconductor handle substrate has a bulk resistivity of at least about 500 ohm-cm;

depositing a polycrystalline silicon layer on the oxide layer;

depositing a dielectric layer on the polycrystalline silicon layer; and bonding a front surface of a single crystal semiconductor donor substrate to the dielectric layer of the single crystal semiconductor handle substrate to thereby form a bonded multilayer structure comprising the single crystal semiconductor handle substrate, the oxide layer, the polycrystalline silicon layer, the dielectric layer, and the single crystal semiconductor donor substrate, wherein the single crystal semiconductor donor substrate comprises two major, generally parallel surfaces, one of which is the front surface of the single crystal semiconductor donor substrate and the other of which is a back surface of the single crystal semiconductor donor substrate, a circumferential edge joining the front and back surfaces of the single crystal semiconductor donor substrate, and a central plane between the front and back surfaces of the single crystal semiconductor donor substrate, and further wherein the semiconductor donor substrate comprises a cleave plane.

2. The method of claim 1 wherein the single crystal semiconductor handle substrate comprises silicon.

3. The method of claim 1 wherein the single crystal semiconductor handle substrate comprises a silicon wafer sliced from a single crystal silicon ingot grown by the Czochralski method or the float zone method.

4. The method of claim 1 wherein the bulk resistivity of the single crystal semiconductor handle substrate is between about 500 ohm-cm and about 100,000 ohm-cm.

5. The method of claim 1 wherein the bulk resistivity of the single crystal semiconductor handle substrate is between about 2000 ohm-cm and about 10,000 ohm-cm.

6. The method of claim 1 wherein the bulk resistivity of the single crystal semiconductor handle substrate is between about 3000 ohm-cm and about 10,000 ohm-cm.

7. The method of claim 1 wherein the bulk resistivity of the single crystal semiconductor handle substrate is between about 3000 ohm-cm and about 5,000 ohm-cm.

8. The method of claim 1 wherein the oxide layer has a thickness between about 20 angstroms and about 400 angstroms.

9. The method of claim 1 wherein the oxide layer has a thickness between about 50 angstroms and about 200 angstroms.

10. The method of claim 1 wherein the polycrystalline silicon layer has a thickness between about 50 nanometers and about 4000 nanometers.

11. The method of claim 1 wherein the polycrystalline silicon layer has a thickness between about 100 nanometers and about 2000 nanometers.

12. The method of claim 1 wherein the dielectric layer comprises a material selected from the group consisting of silicon dioxide, silicon nitride, silicon oxynitride, hafnium oxide, titanium oxide, zirconium oxide, lanthanum oxide, barium oxide, and a combination thereof.

13. The method of claim 1 wherein the dielectric layer has a thickness of at least about 10 nanometers.

14. The method of claim 1 wherein the front surface of a single crystal semiconductor donor substrate comprises a semiconductor oxide layer.

15. The method of claim 1 further comprising mechanically cleaving the bonded structure at the cleave plane of the single crystal semiconductor donor substrate to thereby prepare a cleaved multilayer structure comprising the single crystal semiconductor handle substrate, the oxide layer, the polycrystalline silicon layer, the dielectric layer, and a single crystal semiconductor device layer.

16. The method of claim 15 further comprising heating the cleaved multilayer structure at a temperature between about 1000° C. and about 1200° C. and for a duration between about 0.5 hours and about 8 hours to strengthen the bond between the single crystal semiconductor device layer and the single crystal semiconductor handle substrate.

* * * * *